(12) United States Patent
Bowler

(10) Patent No.: US 7,443,177 B1
(45) Date of Patent: Oct. 28, 2008

(54) CHARACTERIZATION OF CONDUCTOR BY ALTERNATING CURRENT POTENTIAL-DROP METHOD WITH A FOUR-POINT PROBE

(75) Inventor: Nicola Bowler, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 11/421,323

(22) Filed: May 31, 2006

Related U.S. Application Data

(60) Provisional application No. 60/686,061, filed on May 31, 2005.

(51) Int. Cl.
*G01R 27/08* (2006.01)
(52) U.S. Cl. .................. 324/715; 324/691; 324/713
(58) Field of Classification Search .......... 324/715, 324/691, 713
See application file for complete search history.

(56) References Cited

U.S. PATENT DOCUMENTS

| | | | | |
|---|---|---|---|---|
| 4,667,149 | A * | 5/1987 | Cohen et al. | 324/715 |
| 5,202,641 | A * | 4/1993 | Unvala | 324/715 |
| 5,503,001 | A * | 4/1996 | Wong | 73/38 |
| 6,086,734 | A * | 7/2000 | Harada | 204/298.03 |
| 6,218,846 | B1 * | 4/2001 | Ludwig et al. | 324/713 |
| 6,323,661 | B1 * | 11/2001 | Wildes et al. | 324/719 |
| 6,331,778 | B1 * | 12/2001 | Daily et al. | 324/557 |
| 6,552,553 | B2 * | 4/2003 | Shoji et al. | 324/692 |
| 6,636,050 | B2 * | 10/2003 | Nakayama et al. | 324/537 |
| 6,744,263 | B2 * | 6/2004 | Amini | 324/644 |
| 6,819,120 | B2 * | 11/2004 | Tam | 324/633 |
| 7,106,194 | B2 * | 9/2006 | Nelson | 340/551 |

FOREIGN PATENT DOCUMENTS

GB 2062241 A * 5/1981

OTHER PUBLICATIONS

Bowler, Nicola et al. "Model-Based Characterization of Homogeneous Metal Plates by Four-Point Alternating Current Potential Drop Measurements" IEEE Transactions on Magnetics, vol. 41, No. 6, Jun. 2005, pp. 2102-2110.

Reynolds, J. M., 1997 Introduction to Applied and Environmental Geophysics Chichester: Wiley, pp. 426-467.

M. Yamashita and M. Agu, "Geometrical Correction factor for semiconductor resistivity measurements by four-point probe method", Japanese J. Appl. Phys., vol 23, No. 11, pp. 1499-1504 (1984).

(Continued)

*Primary Examiner*—Diego Gutierrez
*Assistant Examiner*—John Zhu
(74) *Attorney, Agent, or Firm*—McKee, Voorhees & Sease, P.L.C.

(57) ABSTRACT

A method of determining material parameters associated with a conductor using four points includes injecting and extracting alternating current into the plate using current-carrying wires operatively connected to two of the four points, measuring potential drop between the remaining two of the four points, and calculating the material parameters. The conductor can be of a homogenous material, a stratified material, or other type of material. The conductor can have any number of geometries, including that of a plate, a cylinder, a tube, a stratified cylinder or other shape.

20 Claims, 10 Drawing Sheets

OTHER PUBLICATIONS

Dodd, C.V. et al. "Measurement of Small Magnetic Permeability Changes by Eddy Current Techniques", Materials Evaluation 29(10), Oct. 1971, pp. 217-221.

Bowler, Nicola "Part 3. Conductivity Testing" Nondestructive Testing Handbook, vol. 5 Electromagnet Testing, 2004 3rd ed., Chapter 13, Parts 3 and 5, pp. 329-336; pp. 342-343.

Bowler, Nicola et al. "Approximate Theory of Four-Point Alternating Current Potential Drop on a Flat Metal Surface"; 2005 Meas. Sci. Technol. 16 2193-200.

Mitrofanov V A, "Problems of the Theory of the Electric Potential Method of Nondestructive Inspect Alternating Current" 1998 Russ. J. Nondestr. Test. 34 183-9.

Bowler, Nicola, "Theory of Four-Point Alternating Current Potential Drop Measurements on a Metal Half-space"; Journal of Physics D: Applied Physics 39 (2006) pp. 584-589.

Bowler, N. "Frequency-Dependence of Relative Permeability in Steel" Review of Quantative Nondestructive Eval., vol. 25, 2006; pp. 1269-1276.

Bowler, Nicola et al. "Electrical Conductivity Measurement Using Broadband Eddy-Current and Four-Point Methods", 2005 Center for Nondestructive Evaluation, pp. 1-16.

Huang, Yongqiang "Alternating Current Potential Drop and Eddy Current Methods for Nondestructive Evaluation of Case Depth", 2004, Iowa State University, Ames, IA, pp. 1-135.

* cited by examiner

CHARACTERIZATION OF CONDUCTOR BY ALTERNATING CURRENT POTENTIAL-DROP METHOD WITH A FOUR-POINT PROBE

PRIORITY STATEMENT

This application claims priority to U.S. Provisional Patent Application No. 60/686,061, filed May 31, 2005, herein incorporated by reference in its entirety.

BACKGROUND OF THE INVENTION

The present invention relates generally to the characterization of conductive objects or surfaces, such as, without limitation metal plates, rods, coatings using non-destructive evaluation techniques and in particular using a four-point probe. Measurements of electrical conductivity (or resistivity) are useful in metal sorting, alloy identification, heat-treatment monitoring of aluminum alloys, and detection of flaws which are manifest as a change in the material conductivity, such as thermal damage in aircraft structures. Prior art methods include existing four-point methods for measuring metal conductivity or thickness that use direct current or the use of standard eddy-current instruments for measuring metal conductivity. These types of approaches have limited utility. For example, where direct current is used only a limited number of material properties can be accurately determined. In addition, there are problems with use of too much current, ionic deposition problems, the need for geometric correction factors, and a host of other problems. Standard eddy-current instruments for measuring metal conductivity cannot be used in the case of ferrous metals.

BRIEF SUMMARY OF THE INVENTION

Therefore it is a primary, object, feature, or advantage of the present invention to improve upon the state of the art.

It is a further object, feature, or advantage of the present invention to provide for using four contact points on a conductive object to determine characteristic information about the conductive object such as dimensions, electrical conductivity, and magnetic permeability.

Yet another object, feature, or advantage of the present invention is to provide for using four contact points on a metal plate to determine characteristic information about a metal plate such as thickness, electrical conductivity, and magnetic permeability.

A further object, feature, or advantage of the present invention is to provide for using four contact points on a metal rod to determine characteristic information about the metal rod.

Yet a further object, feature, or advantage of the present invention is to provide for using four contact points on a conductive surface to determine characteristic information about the conductive surface, including where the conductive surface is a coating.

Another object feature, or advantage of the present invention is to provide for a method of determining both electrical conductivity and magnetic permeability.

Yet another object, feature, or advantage of the present invention is to provide a method that uses a multiple frequency approach rather than a direct current or single-low frequency approach.

A still further object, feature, or advantage of the present invention is to provide for a four contact point method to determine characteristics of a conductive plate comprised of ferrous metals.

Another object, feature, or advantage of the present invention is to provide a method for accurate measurement of small changes and/or differences in magnetic permeability.

Yet another object, feature, or advantage of the present invention is to provide a method that can assist in determining the processing history of metals such as stainless steels by accurate measurement of small changes in magnetic permeability when the value is close to unity.

A further object, feature, or advantage of the present invention is to provide a method of measuring electrical conductivity that is accurate and consistent.

A still further object, feature, or advantage of the present invention is to provide a method of measuring electrical conductivity that becomes more accurate as conductivity decreases.

Another object, feature, or advantage of the present invention is to provide a method for measuring magnetic permeability which is simple and low cost.

Yet another object, feature, or advantage of the present invention is to provide a method for measuring electrical conductivity which does not rely on time-consuming prior calibrations.

A further object, feature, or advantage of the present invention is to provide for an accurate, portable conductivity measurement system.

One or more of these and/or other objects, features, or advantages of the present invention will become apparent from the specification and claims that follow.

According to one aspect of the present invention, a method of determining material parameters associated with a conductor using four points is provided. The method includes injecting and extracting alternating current into the conductor using current-carrying wires operatively connected to two of the four points, measuring potential drop between the remaining two of the four points, and calculating the material parameters of the conductor using the potential drop and the alternating current. The material parameters which can be measured include, magnetic permeability, electrical conductivity (or resistivity), geometry parameters (such as plate thickness, when the conductor is a plate). The conductor can be, for example, a metal plate, a stratified conductor, a conductive surface treatment, a coating, a ferrous metal, a metal half space, metal rod or tube. The four points may be co-linear, may be oriented in a rectangular configuration or randomly or arbitrarily placed.

According to another aspect of the present invention a method is provided for determining material parameters associated with a conductor by using a four points probe. The method includes injecting and extracting alternating current into the conductor using current-carrying wires operatively connected to two of the four points of the four point probe, measuring potential drop, V, between the remaining two (p, q) of the four points of the four point probe, and applying an analytical expression relating the voltage, V, measured between points p and q, the electromagnetic skin depth of the conductor and the amplitude of the alternating current to determine the magnetic permeability and conductivity of the conductor.

Generally, the method relies on electrical contact to a conductor by means of four points. Two points facilitate injection and extraction of alternating current into/out of the plate means of current-carrying wires. The other two facilitate measurement of potential drop (voltage) between points on the surface of the conductor by a high-impedance voltmeter. The measured voltage can be used to infer characteristic information about the conductor and properties such as electrical conductivity, and magnetic permeability.

The present invention uses alternating current at a number of fixed frequencies. This permits a greater number of material parameters to be determined than if direct current is used, including accurate determination of magnetic permeability. Generally, the present invention needs less current, avoids ionic deposition problems, requires fewer geometric correction factors and may give a larger voltage signal than prior art methods.

DETAILED DESCRIPTION OF THE PREFERRED EMBODIMENT

Figure 1:
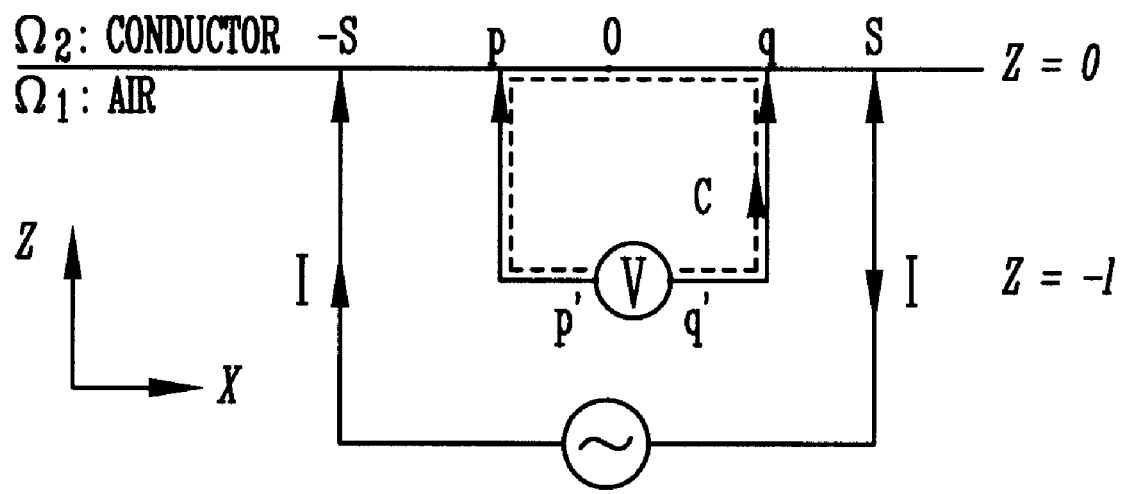
FIG. 1 is a schematic showing a path of integration.

The present invention provides a method of quantifying both electrical conductivity and magnetic permeability. The methodology can be applied to objects of varying geometries, including, but not limited to plates, cylindrical rods, and other geometries. In addition, the methodology can be used for characterizing surface treatments or other forms of layered structures in metals. In other words, the object being characterized need not be homogenous. Thus, the present invention provides a flexible methodology for quantifying or characterizing electrical conductivity and magnetic permeability for a variety of materials in a variety of environments or situations.

Measurements of voltage are taken at a number of specific frequencies. The low-frequency voltage values are entered into a theoretical formula to calculate either the metal conductivity or thickness. One of these must be known independently in order to calculate the other. Higher-frequency voltage values are entered into a theoretical formula (along with the conductivity and plate thickness) to calculate the magnetic permeability. On samples tested, conductivity measurements are accurate to within 1% of values obtained by an independent (eddy-current) method. The MIZ-21A eddy-current instrument measures conductivity to at best 1% and possibly only 20% accuracy for low conductivity metals such as stainless steel. In order to measure magnetic permeability by an eddy-current method, low-frequency instrumentation is required because the conductivity and permeability remain coupled in their behavior until low frequencies are reached. In the proposed method, the conductivity becomes decoupled from the permeability at significantly higher frequency, making it possible to measure both parameters easily using the same technology. Very small variations in magnetic permeability (±0.01) are observable for low permeability metals.

The method relies on a theoretical formula for interpretation of the measurement data and deduction of the parameters of the metal plate. This theoretical formula has not previously been derived in the case of alternating current.

The alternating current potential drop (ACPD) method measures the voltage, $\mathcal{V}$, between two pick-up points on the surface of a conductor. For the configuration shown in FIG. 1, $$\mathcal{V} = V + \varepsilon = -\int_{(p,y,0)}^{(q,y,0)} E \cdot dl + \oint_C E \cdot dl, \quad (A.1)$$

where C is a closed loop [1]. $\varepsilon$ is the rate of change of magnetic flux within the loop.

In direct current potential drop measurements there is no induction effect in the measurement circuit ($\varepsilon=0$) since the current does not vary with time and in this case the measured potential drop is almost exclusively due to the conductor. In ACPD measurements, the contribution to $\mathcal{V}$ from the conductor dominates when the frequency is sufficiently low, since the inductive contribution from the measurement circuit, i$\omega$L, is proportional to frequency $\omega$. At sufficiently high frequency the inductive term dominates. In this work, both contributions to $\mathcal{V}$ are evaluated. The far-field approximation for E is used in calculating $\mathcal{V}$. This approximation gives accurate results when pick-up points at (p, y, 0) and (q, y, 0) are sufficiently far from the source points at (±S, 0, 0), in practice a few electromagnetic skin depths ($\delta$) in the conductor and the conductor is somewhat thinner than the probe spacing, as shown for direct current potential drop measurements [10, 11].

Electric Field

For the configuration shown in FIG. 1, the electric field can be obtained by superposition of fields separately associated with the two current-carrying wires:

$$E^T(r) = E(r_+) - E(r_-), \quad (A.2)$$

where $r_\pm = \sqrt{(x\pm S)^2 + y^2 + z^2}$. In the following sections the far-field form of E is determined in the region of the pick-up circuit (air) and in the metal plate for a single current-carrying wire located on the axis of a cylindrical co-ordinate system.

Probe Region

For a single wire passing current I into, or out of, a conductive plate, there are two contributions to the electric field in air. One is from the current flowing in the wire, $E^W$, and the other is from the current density in the plate. In the far-field regime, for the closed loop C, only $E^W$ is important. Assuming that the wire is perpendicular to the surface of the plate and that the current has time-dependence $e^{-i\omega t}$, the integral form of Ampere's Law and then Faraday's Law yields $$E^W(\rho, z) = \hat{z}\frac{i\omega\mu_0 I}{2\pi}\ln\rho, \quad \rho \to \infty, z \leq 0, \tag{A.3}$$

where $\rho$ is the radial co-ordinate of a cylindrical system centered on the wire and $E^W$ has the same direction as the current density in the wire, $J = \hat{z}J_z$.

Plate

An expression for the electric field in the conductive plate is obtained in a manner similar to that given in reference [2] for a conductive half-space. For a current source oriented perpendicular to the surface of the plate, only the transverse magnetic (TM) potential, $\psi''$, is required to fully describe the electric field:

$$E(r) = -i\omega\mu\nabla\times\nabla\times\hat{z}\Psi''(r) \tag{A.4}$$

Define a Modified TM Potential $$\Psi = \nabla_z^2 \psi'', \tag{A.5}$$

where $\nabla_z \equiv \nabla - \hat{z}(\partial/\partial z)$ is the transverse differential operator. For a plate infinite in x and y, occupying $z \in [0, T]$, the governing equation is $$(\nabla^2 + k^2)\Psi(r) = 0, 0 \leq z \leq T, \tag{A.6}$$

where $k^2 = i\omega\mu\sigma$ with $\mu$ and $\sigma$ being the permeability and conductivity of the plate, respectively. In the plate, only the horizontal component of the electric field, $E_\rho$, contributes to V. It is not convenient to express $E_\rho$ in terms of $\Psi$. Rather, $E_\rho$ will be obtained from the following equation by means of relationship (A.5).

$$E_\rho(r) = -i\omega\mu\frac{\partial^2 \psi''(r)}{\partial\rho\partial z}, \tag{A.7}$$

where $\rho$ and z are co-ordinates of the cylindrical system. Equation (A.6) is solved for T subject to boundary conditions $$\Psi(\rho, 0) = C(\rho) \text{ where } C(\rho) = \begin{cases} \frac{I}{\pi(ka)^2}, & \rho \leq a, \\ 0, & \rho > a, \end{cases} \tag{A.8}$$

and $$\Psi(\rho, T) = 0. \tag{A.9}$$

These derive from the fact that, at the surface of the plate, the normal component of current density is continuous-zero everywhere apart from at the point of contact with the current carrying wire, radius $\alpha$. Applying the zero-order Hankel transform to solve (A.6) and taking the limit $\alpha \to 0$ yields $$\Psi(\rho, z) = \frac{I}{2\pi k^2}\int_0^\infty e^{-\gamma z}\left[\frac{1 - e^{2\gamma(z-T)}}{1 - e^{-2\gamma T}}\right]J_0(\kappa\rho)\kappa\, d\kappa, \tag{A.10}$$

where $\gamma^2 = \kappa^2 - k^2$. If $T \to \infty$, the term in square brackets tends to unity and the resulting integral is identical to that obtained for a half-space conductor [2].

It is possible to evaluate the integral (A.10) analytically by expanding the term in the denominator as a binomial series [4, 3.6.10]:

$$(1 - e^{-2\gamma T})^{-1} = \tag{A.11}$$

$$1 + e^{-2\gamma T} + e^{-4\gamma T} + e^{-6\gamma T} + e^{-8\gamma T} + \ldots = \sum_{n=0}^\infty e^{-2n\gamma T}.$$

Multiplying the right-hand side of (A.11) by the factor $e^{-\gamma z}[1 - e^{2\gamma(z-T)}]$ and substituting the result into (A.10) yields $$\Psi(\rho, z) = \frac{I}{2\pi k^2}\sum_{n=0}^\infty \int_0^\infty \{e^{-\gamma(z+2nT)} - e^{\gamma[z-2(n+1)T]}\}J_0(\kappa\rho)\kappa\, d\kappa, \tag{A.12}$$

where the order of summation and integration has been reversed. The first term in braces in (A.12), $e^{-\gamma z}$, gives rise to the result for the TM potential in a half-space conductor. The second term, $-e^{\gamma(z-2T)}$, accounts for the primary reflection of the field from the surface of the plate at $z=T$. Other terms deal with multiple reflections between the surfaces of the plate. By analogy with the result for the half-space conductor, reference [2], or by multiple use of the analytic result given in reference [5], result 8.2.23, the terms in (A.12) can be integrated. It is found that $$\Psi(\rho, z) = -\frac{I}{2\pi}\sum_{n=0}^\infty \left\{\frac{ik(z+2nT)}{(ikr_n)^3}e^{ikr_n}(1 - ikr_n) + \right.\tag{A.13}$$

$$\left.\frac{ik[z-2(n+1)T]}{(ikr'_n)^3}e^{ikr'_n}(1 - ikr'_n)\right\}, 0 \leq z \leq T,$$

wherein $$r_n = \sqrt{\rho^2 + (z+2nT)^2} \text{ and } r'_n = \sqrt{\rho^2 + [z-3(n+1)T]^2}.$$

To obtain $E_\rho$ from $\Psi$ as given in (A.13) via relations (A.7) and (A.5) requires some manipulation [2]. The result is $$E_\rho(r) = -\frac{ikI}{2\pi\sigma\rho}\sum_{n=0}^\infty \left\{e^{ik(z+2nT)} - \right.\tag{A.14}$$

$$\frac{e^{ikr_n}}{ikr_n}\left[1 + \frac{[ik(z+2nT)]^2}{ikr_n}\left(1 - \frac{1}{ikr_n}\right)\right] + e^{-ik[z-(2n+1)T]} -$$

$$\left.\frac{e^{ikr'_n}}{ikr'_n}\left[1 + \frac{\{ik[z-2(n+1)T]\}^2}{ikr'_n}\left(1 - \frac{1}{ikr'_n}\right)\right]\right\}, 0 \leq z \leq T.$$

In the far field, the electric field is dominated by terms of the form $e^{ikz}/\rho$ and $$E_\rho(r) = -\frac{ikI}{2\pi\sigma\rho}\sum_{n=0}^\infty \{e^{ik(z+2nT)} + e^{-ik[z-2(n+1)T]}\}, \rho \to \infty, 0 \leq z \leq T. \tag{A.15}$$

If the far-field current density is integrated over a cylindrical surface of large radius extending from $z=0$ to T, the result is $I[1 + e^{ik(2N-1)T}]$ for a series truncated to N terms. This expression tends to I as N→∞, as it should. If T→∞ the far-field expression for the electric field in a half-space conductor is recovered [2]

$$E_\rho(r) = -\hat{\rho}\frac{ikI}{2\pi\sigma\rho}e^{ikz}, \quad \rho \to \infty, \quad z \geq 0. \tag{A.16}$$

This expression was also given in reference [3] in the context of fatigue crack measurement.

Voltage Calculation

Voltage is now calculated according to Equation (A.1). For the configuration shown in FIG. 1 the contributions are $$\mathcal{V} = V + \varepsilon = \tag{A.17}$$
$$-\int_p^q E_x^T(x, y, 0)dx + \int_0^{-l} E_z^T(p, y, z)dz + \int_{-l}^0 E_z^T(q, y, z)dz,$$

with $E^T$ given by (A.2). It is a simple matter to evaluate the last two terms on the right-hand side of equation (A.17) with $E_z$ given in equation (A.3). To neatly evaluate the first term on the right-hand side of (A.17) recognize that, at the surface defined by z=0, equation (A.15) can be written $$E_\rho(\rho, 0) = -\frac{ikI}{2\pi\sigma\rho}\left[\left(2\sum_{n=0}^\infty e^{2iknT}\right) - 1\right], \quad \rho \to \infty. \tag{A.18}$$

Further [4, equation 3.6.10], $$\sum_{n=0}^\infty e^{2iknT} = \frac{1}{1 - e^{2ikT}},$$

so that $$E_\rho(\rho, 0) = \frac{ikI}{2\pi\sigma\rho}\coth(ikT), \quad \rho \to \infty. \tag{A.19}$$

The final expression for $\mathcal{V}$ is $$\mathcal{V} = \tag{A.20}$$
$$\frac{I}{4\pi}\left[-\frac{ik}{\sigma}\coth(ikT) + i\omega\mu_0 l\right]\ln\left\{\left[\frac{(p-S)^2 + y^2}{(p+S)^2 + y^2}\right]\left[\frac{(q+S)^2 + y^2}{(q-S)^2 + y^2}\right]\right\}.$$

The first term in equation (A.20) is the contribution from the conductor and has approximately equal real and imaginary parts. The contribution from the measurement circuit is imaginary (inductive) and proportional to the dimension of the circuit perpendicular to the conductor surface, l. For a typical non-magnetic metal and l~1 mm, the inductive term is practically negligible for frequencies up to about 10 Hz whereas at $10^4$ Hz the terms are of similar magnitude. The logarithmic term represents the physical arrangement of the four probe points.

Experiment

ACPD measurements were made as a function of frequency on a brass plate whose conductivity and dimensions are given in Table 1. The brass plate was precision ground to remove surface scratches and mounted on a two-inch thick plastic support plate. Electrical contact with the brass plate was made via sprung, point contacts, held perpendicular to the surface of the plate. In this experiment the four contact points were arranged in a straight line, with a common midpoint between the two current drive points and the two pick-up points. The dimensions of the probe are given in Table 1.

TABLE 1

Experimental parameters.

| brass plate | probe (FIG. 1) |
|---|---|
| conductivity, σ (MSm$^{-1}$) 16.2 ± 0.3 | S (mm) 38.2 ± 0.3 |
| thickness, T (mm) 5.66 ± 0.01 | p (mm) −9.18 ± 0.01 |
| horizontal dimensions (mm) 615 × 616 | q (mm) 9.18 ± 0.01 |
| | l (mm) 0.35 (fitted value) |

The two current-carrying wires were held perpendicular to the plate surface for a distance of 16 inches, after which they were twisted together to reduce the effects of inter-wire capacitance. This distance was sufficient to remove any effect of motion of the current wires on the measured voltage. The two pick-up wires were arranged with the objective of minimizing l, lying as close to the plate surface as possible. They were twisted together at the midpoint between the pick-up points.

In the theoretical calculation, two measured values are needed. One is the current through the plate, the other is the voltage measured by the pick-up probe. To monitor the current in the plate, a high precision resistor was connected in series with the drive current circuit and the voltage across the resistor measured. The resistance maintains one percent accuracy over the range of frequency for which it could be measured with an Agilent 4294A precision impedance analyzer; 40 Hz to 40 kHz. The voltage across the resistor and that of the pick-up probe were both measured using a Stanford Research Systems SR830 DSP lock-in amplifier.

In order to make both voltage measurements using the same lock-in amplifier, a switch was used activated by a control signal from the auxiliary analog output of the lock-in amplifier. It was necessary to correct the experimental data for common-mode rejection (CMR) error in the lock-in amplifier. This systematic error shows itself in the fact that, when the pickup terminals are reversed, the measured voltage changes by a few μV. The magnitude of the error is, therefore, similar to that of the voltage being measured, and a corrective procedure is essential. The CMR error was eliminated by taking two sets of measurements, reversing the pick-up terminals for the second. The two sets were then subtracted and the result divided by two.

The drive current was produced by a Kepco bipolar operational power supply/amplifier, model number BOP 20-20M. The sine signal from the internal function generator of the lock-in amplifier was connected to the current programming input of the power supply, with the power supply working as a current drive.

The conductivity of the plate was measured using a MIZ-21A eddy current instrument. The error quoted in Table 1 is estimated from the manufacturer's literature and derives from a combination of inaccuracy in the instrument, inaccuracy in the comparative standards and probe lift-off error.

Figure 2:
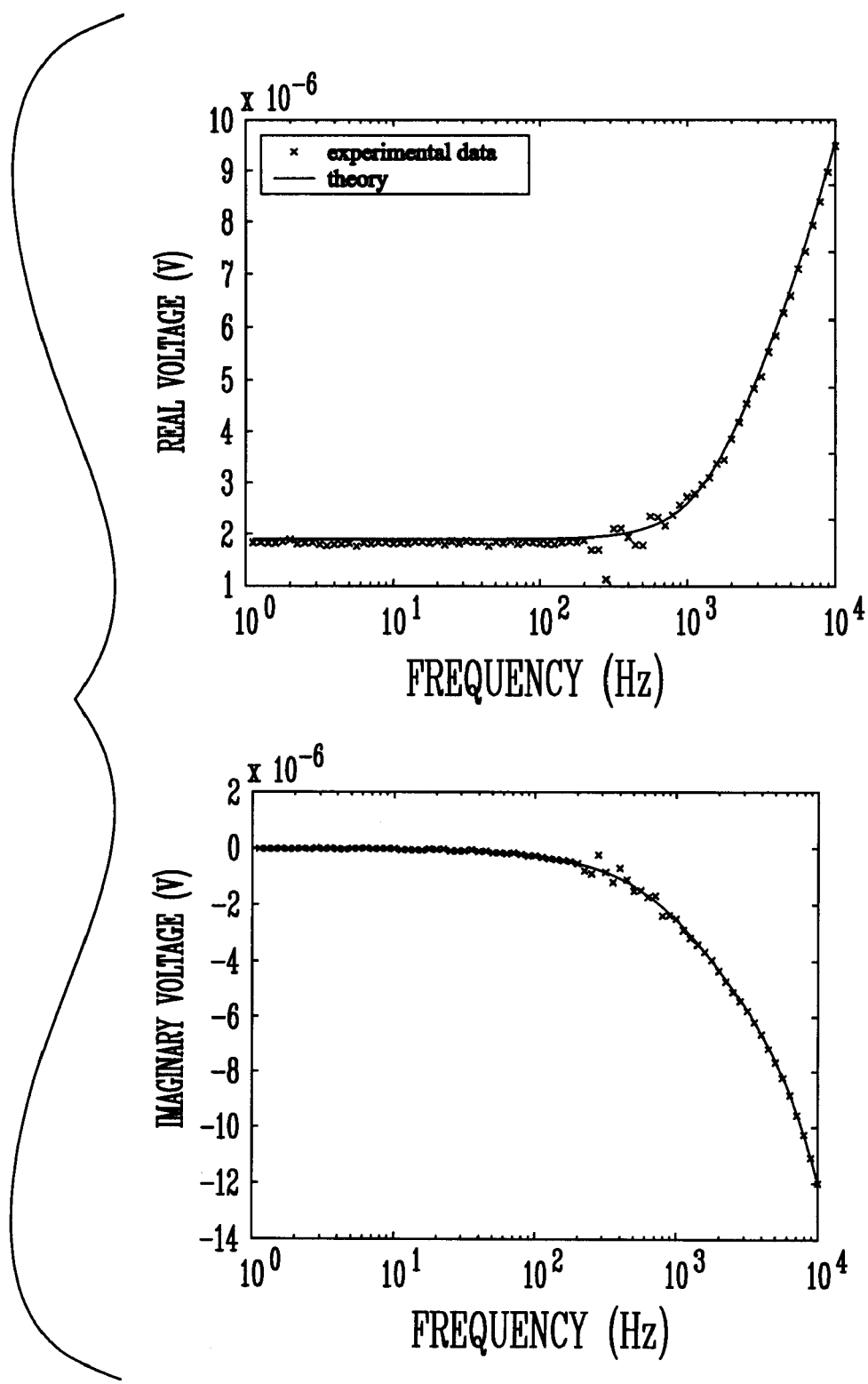
FIG. 2 is a graph showing ACPD measurements on a brass plate compared with theory.

In FIG. 2, ACPD measurements are compared with theory. The average of ten data sets (taken sequentially) is shown. The value of I was adjusted in the calculation to obtain the best fit to the high frequency imaginary part of the data, having negligible influence on the low-frequency data. The value l=0.35 mm appears reasonable since the pick-up wire is AWG 32 with diameter 0.2 mm. The agreement between theory and experiment is excellent. There is no obvious error in the imaginary part of V. The theory overestimates the low frequency real part of V by 3%. Applying standard error analysis to the low frequency limiting expression for V, equation (A.22), shows that errors in the plate conductivity and in the relative positions of the probe points combine to give an experimental error which is also 3%.

Limiting Case: Low Frequency

To take the limit k→0 in equation (A.20), not that $\lim_{k \to 0}$ [ikT/sinh(ikT)]=1. Then $$V \to -\frac{I}{2\pi\sigma T} \ln\left\{\left[\frac{(p-S)^2 + y^2}{(p+S)^2 + y^2}\right]\left[\frac{(q+S)^2 + y^2}{(q-S)^2 + y^2}\right]\right\}, \quad k \to 0. \quad (A.22)$$

Figure 3:
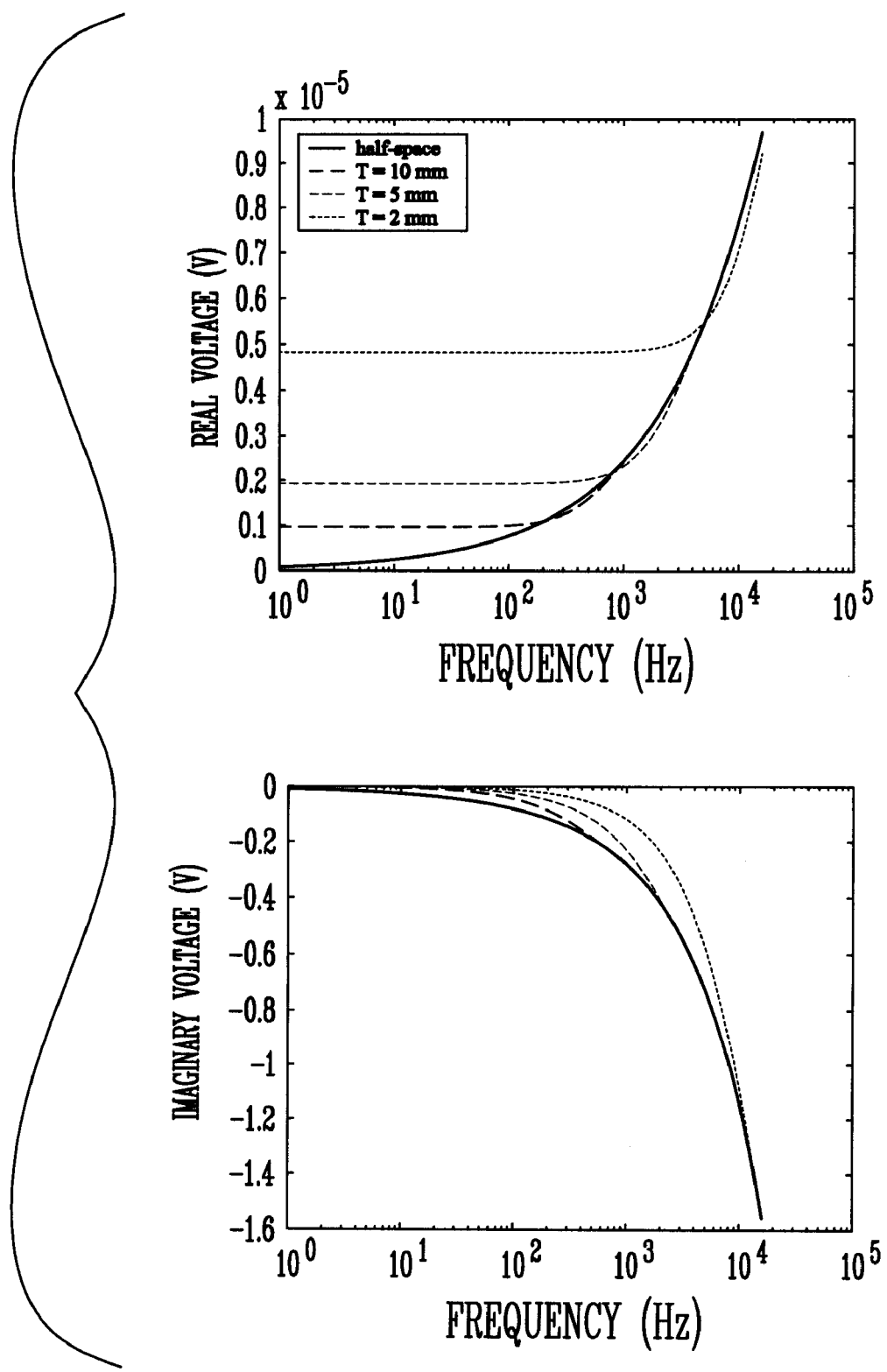
FIG. 3 is a graph showing calculated values of $\mathcal{V}$ as a function of frequency and plate thickness.

It is seen that at low frequency the voltage is real, being inversely proportional to the plate thickness and conductivity. Formula (A.22) is consistent with one given by Yamashita and Masahiro for four-point DC measurements on a finite plate [6]. In FIG. 3, $\mathcal{V}$ is plotted for a number of values of plate thickness. The inverse dependence of Re($\mathcal{V}$) on the plate thickness at low frequency, predicted by equation (A.22), can be clearly seen in FIG. 3.

Limiting Case: High Frequency

Figure 4:
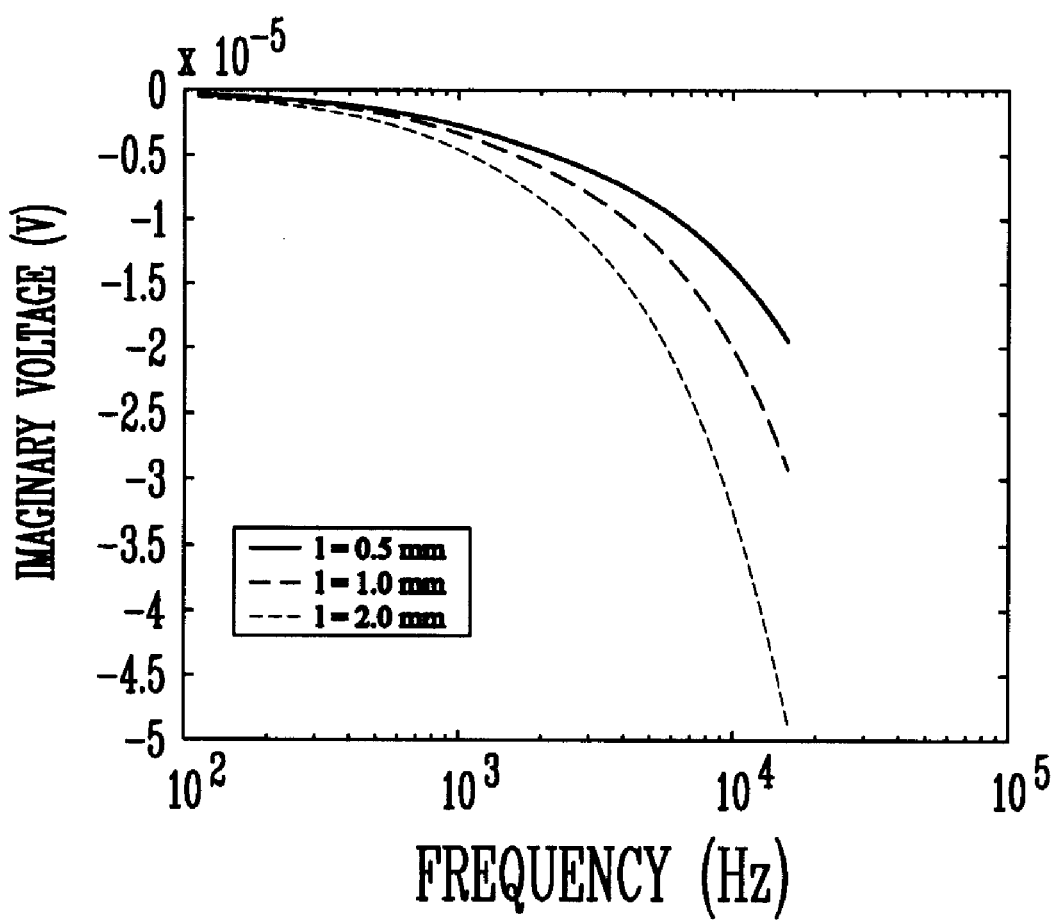
FIG. 4 is a graph showing calculated values of Im($\mathcal{V}$) as a function of frequency and perpendicular length of the pick-up wire, l.

At high frequency the voltage is dominated by the inductive term in equation (A.20). This term is proportional to l, the length of the pick-up wire perpendicular to the metal plate. Practically it is desirable to minimize the contribution of this term by making l as small as possible. In this way the contribution to $\mathcal{V}$ due to the plate, from which useful information may be derived, is not masked by induction in the measurement circuit. In FIG. 4, the effect on $\mathcal{V}$ of varying l is shown. Only Im($\mathcal{V}$) is shown since l has no influence on Re($\mathcal{V}$).

Therefore, a four-point method of measuring material parameters has been disclosed. The simple analytic result, equation (A.20), gives useful insight into the primary contributors in ACPD measurements. It is accurate for a flat plate whose edges are several tens of skin depths from the probe, for a probe whose pick-up points are several skin depths away from the current drive points and for a conductor somewhat thinner than the probe point spacing.

Of course the present invention has numerous applications, including but not limited to use in non-destructive quantification of metal plates of titanium/nickel alloys such as used in aircraft engines, metal billets, and other uses where material evaluation or process monitoring is used. These applications further include applications where non-destructive quantification of metal thickness is needed and access is restricted to one side. The present invention has been used to measure a variety of different types of conductors including brass, aluminum, stainless steel, carbon steel and spring steel. The present invention is not to be limited to the specific disclosure presented herein, as one skilled in the art having the benefit of this disclosure would appreciate the far-reaching scope of the present invention.

Metal Half Spaces

The present invention also provides for the use of four-point alternating current potential drop measurements on a metal half-space. An analytic expression is derived and used to describe the complex voltage measured between the pickup points of a four-point probe, in contact with the surface of a half-space conductor. The alternating current potential drop (ACPD) measurements permit depth-dependent information to be obtained through the phenomenon of the electromagnetic skin effect, in which the current is confined to flow in a 'skin' at the surface of the conductor, whose depth is approximately inversely proportional to the square root of the excitation frequency. The ACPD technique therefore has application in assessing materials whose electromagnetic parameters vary with depth, for example, in the case of electrically conductive surface treatments and coatings. One advantage of ACPD over DCPD is that a lower measuring current can be applied in order to achieve a given sensitivity [10] (section 8). This reduces the risk of heating of the specimen and associated changes in electrical conductivity.

In previous work, Mitrofanov derived an expression for the complex voltage measured between the pickup points, of a four-point probe, in contact with the surface of a half-space conductor [12]. The solution was expressed in terms of an infinite series expansion in powers of k, where $$k = \frac{1+i}{\delta} \quad \text{with} \quad \delta = \left(\frac{2}{\omega\mu\sigma}\right)^{1/2}, \quad (B.1)$$

δ being the electromagnetic skin depth in the conductor. In equation (B.1), ω=2πf is the angular frequency of the injected current and μ and σ are the magnetic permeability and electrical conductivity of the half-space, respectively.

The analytical expression describing the complex voltage measured between the pickup points of a four-point probe, in contact with the surface of a half-space conductor, is derived in closed form. There are two contributions to the measured voltage. One arises from the potential drop due to electric current flowing in the conductor. The other arises from induction in the loop of the pickup circuit. Both terms are obtained by integrating analytic expressions for the electric field, derived previously [2, 13], along appropriate paths. It is shown that the closed-form expression obtained here for the potential drop due to current flowing in the conductor can be expressed as a power series in k, giving the same result as that presented in [12]. The contribution to the measured complex voltage due to inductance in the pickup circuit was not analyzed in [12].

Theory is compared with experimental data for co-linear and rectangular arrangements of the four probe points in contact with a thick aluminum block and very good agreement is obtained in both cases.

Analysis

The ACPD method measures a complex voltage, V, which has two contributions:

$$V = v + \epsilon \quad (B.2)$$

The first term, v, is the potential drop between the two points on the plate at which the measurement circuit makes contact with its surface. The source of v is the current in the plate injected by the other two points of the four-point probe. At arbitrary frequency, v is complex. The second contribution, $\epsilon$, is proportional to the inductance of the measurement circuit. It arises form the changing magnetic flux within the loop of the measurement circuit due to harmonic variation of the applied current, of the form $e^{-i\omega t}$, $\epsilon$ is purely inductive, therefore imaginary. In the static limit of direct current, only v remains. For the geometry given in FIG. 5, $$v = \int_{(q,0,0)}^{(p,0,0)} E \cdot dl, \quad (B.3)$$

and $$\varepsilon = \oint_C E \cdot dl, \quad (B.4)$$

Where C is a closed loop in the case where p' and q' coincide, as happens when the pickup wires are twisted together at their point of meeting. At low frequency, the measured potential drop is almost exclusively due to the conductor. In an ACPD measurement on a conductive plate, the contribution to V from the plate is most significant at lower frequencies, with the contribution from $\varepsilon$ becoming larger, and eventually dominant as the frequency increases. Strictly, the quantities V, $v$, $\varepsilon$ and E are complex amplitudes. For brevity, the time dependence is not shown explicitly in equations (B.2) to (B.4) or in the equations that follow.

For current injected into a half-space conductor by a single wire held perpendicular to the conductor surface, the components of the electric field in the conductor are [2]

$$E_\rho^s(r) = -\frac{I}{2\pi\sigma} \frac{ik}{\rho} \left\{ e^{ikz} - \frac{e^{ikr}}{ikr} \left[ 1 + \frac{(ikz)^2}{ikr} \left( 1 - \frac{1}{ikr} \right) \right] \right\}, z > 0, \quad (B.5)$$

$$E_z^s(r) = \frac{I}{2\pi\sigma} \frac{z}{r^3} e^{ikr}(1-ikr), z > 0, \quad (B.6)$$

in which $\rho$ and z are the variables of a cylindrical co-ordinate system centered on the current wire and $r^2 = \rho^2 + z^2$. The electric field in air may be expressed [13] as $$E^S = E^W + E^C, \rho > 0, z \leq 0, \quad (B.7)$$

where $$E^W = \hat{z} \frac{I}{2\pi} i\omega\mu_0 \ln\rho, \rho > 0, z \leq 0, \quad (B.8)$$

and $$E^C = \frac{I}{2\pi\sigma} \int_0^\infty \gamma e^{\kappa z}[\hat{\rho} J_1(\kappa\rho) - \hat{z} J_0(\kappa\rho)] d\kappa, z \leq 0, \quad (B.9)$$

In equation (B.9), $\gamma^2 = \kappa^2 - k^2$ and $J_i(x)$ is the i-th order Bessel function of the first kind. $E^W$ is the electric field in air due to the current flowing in the injection wire. $E^C$ is the electric field in air due to the current flowing in the half-space conductor.

Figure 5:
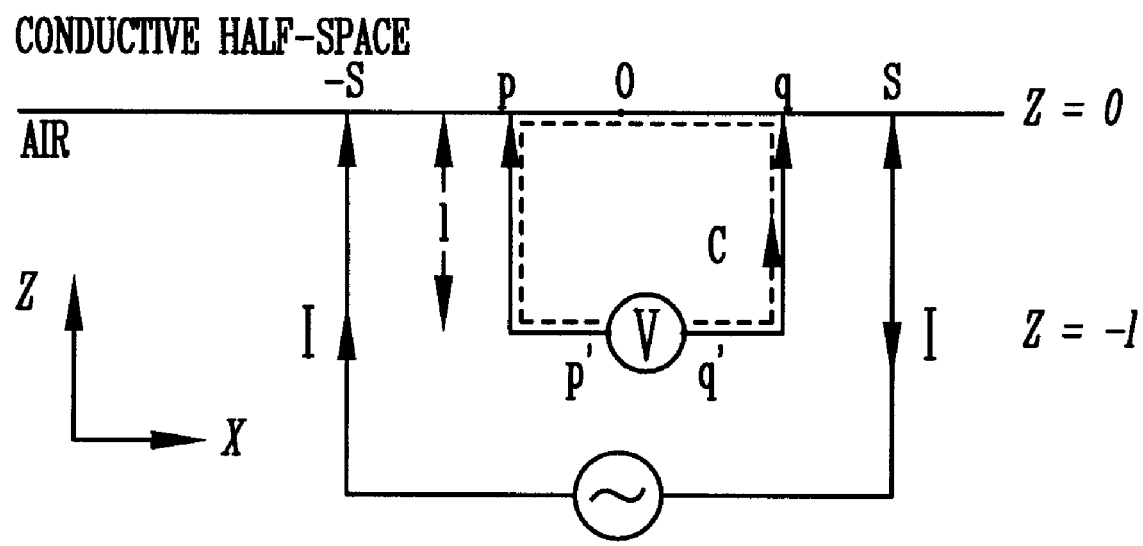
FIG. 5 is a schematic illustrating a four point probe in contact with a conductive half-space. The path of integration, C (- - - -), may occupy any plane of constant y. Here the plane y=0 is shown. l is the dimension of the pickup circuit perpendicular to the conductor surface.

For a system of two current-carrying wires in contact with the metal surface at co-ordinates ($\pm$S,0,0) as shown in FIG. 5, the electric field E can be obtained by the superposition of the field due to a single wire, $E^S$, whose components are given above:

$$E(r) = E^S(r_+) - E^S(r_-)$$

with $r_\pm = \sqrt{(z \pm S)^2 + y^2 + z^2}$

Calculation of $v$

Closed form. In general, the line of the pickup points may be off-set from the line of the current injection points. Let y=c=constant and then choose the path of the integral in equation (B.3) such that $$v = -\int_p^q E_x(x,c,0)dx \quad (B.11)$$

Now, $$E_x(x, c, 0) = \frac{(x+S)}{\rho_+} E_\rho^S(\rho_+, 0) - \frac{(x-S)}{\rho_-} E_\rho^S(\rho_-, 0), \quad (B.12)$$

where $\rho_\pm = \sqrt{(x \pm S)^2 + c^2}$. Combining the above two equations and making the change of variable X=x$\pm$S gives $$v = -I_+ + I_-, \quad (B.13)$$

where $$I_\pm = \int_{p \pm S}^{q \pm S} \frac{X}{\sqrt{X^2 + c^2}} E_\rho^S(X, c, 0) dX. \quad (B.14)$$

Putting $E_\rho^S(X,c,0)$ from equation (B.5) into the integrand of equation (B.14) gives $$I_\pm = \frac{ikI}{2\pi\sigma} \int_{p \pm S}^{q \pm S} \left[ \frac{X}{X^2 + c^2} - \frac{Xe^{ik\sqrt{X^2 + c^2}}}{ik(X^2 + c^2)^{3/2}} \right] dX. \quad (B.15)$$

Integration of the first term in equation (B.15) is straightforward. The second term in equation (B.15) may be evaluated by making a further change of variable, $\alpha = \sqrt{X^2 + c^2}$, and using the following identity (equation 2.325.2) in [14]):

$$\int \frac{e^{ax}}{x^2} dx = -\frac{e^{ax}}{x} - aE_1(-ax), \quad (B.16)$$

in which $E_1(z)$ is the exponential integral function, defined (equation (5.1.1) in [15]) as $$E_1(z) = \int_C^\infty \frac{e^{-t}}{t} dt, |\arg z| < \pi. \quad (B.17)$$

Ultimately, the following expression for $v$ is obtained:

$$v = \frac{I}{2\pi\sigma}[f_i(S+q, c) - f_i(S-q, c) - f_i(S+p, c) + f_i(S-p, c)] \quad (B.18)$$

where, as will be shown subsequently, $f_i(x,y)$ can take several forms. In exact, closed form, $$f_{exact}(x, y) = f_{exact}(\rho = \sqrt{x^2 + y^2}) = \frac{e^{ik\rho}}{\rho} + ik[\ln\rho + E_1(-ik\rho)] \quad \text{(B.19)}$$

Series Form

The result presented in equations (B.18) and (B.19) can be expressed in terms of a power series in k. In this way it can be shown that the result is in agreement with that of an independent calculation [12]. The two relations (equations (4.2.1) and (5.1.11) in [15]

$$e^z = \sum_{n=0}^{\infty} \frac{z^n}{n!}, \quad \text{(B.20)}$$

$$E_1(z) = -\gamma_e - \ln z - \sum_{n=1}^{\infty} \frac{(-1)^n z^n}{nn!}, \quad |\arg z| < \pi, \quad \text{(B.21)}$$

applied to the exponential and exponential integral functions in equation (B.19) give $$f_{exact}(\rho) = -ik[\gamma_e + \ln(-ik) - 1] + f_{series}(\rho) \quad \text{(B.22)}$$

in which $y_e = 0.577216\ldots$ is Euler's constant and $$f_{series}(\rho) = \frac{1}{\rho}\left[1 - \sum_{n=1}^{\infty} \frac{(ik\rho)^{n+1}}{n(n+1)!}\right] \quad \text{(B.23)}$$

Note that the terms present in the relation between $f_{exact}$ and $f_{series}$ (equation (B.22)) are independent of $\rho$. This means that they drop out when inserted into equation (B.18). Hence $f_{series}$ (equation (B.23)) may be inserted directly into equation (B.19) as an alternative to $f_{exact}$ (equation (B.19)). The resulting series representation for v given by combining equations (B.18) and (B.23) agrees with that presented in [12].

Special Cases

One commonly-used probe configuration is that in which the four probe points are arranged along a straight line, with the voltage pickup points positioned symmetrically about the midpoint between the current injection points. In the case of this co-linear, symmetric probe, p=−q and c=0. Equations (B.18) reduces to $$v^{LS} = \frac{I}{\pi\sigma}[f_i(S+q, 0) - f_i(S-q, 0)] \quad \text{(B.24)}$$

For a rectangular probe configuration, in which the line between the current injection points forms one side of the rectangle and that between the voltage pickup points forms the opposite side, p=−S and q=S so that $$v^R = \frac{I}{\pi\sigma}[f_i(2S, c) - f_i(0, c)] \quad \text{(B.25)}$$

In the limit of direct current, k→0 and $$f_{exact}^{DC}(\rho) = f_{series}^{DC}(\rho) = \frac{1}{\rho}, \quad \text{(B.26)}$$

in agreement with results presented in [9, 11, 15].

Figure 6:
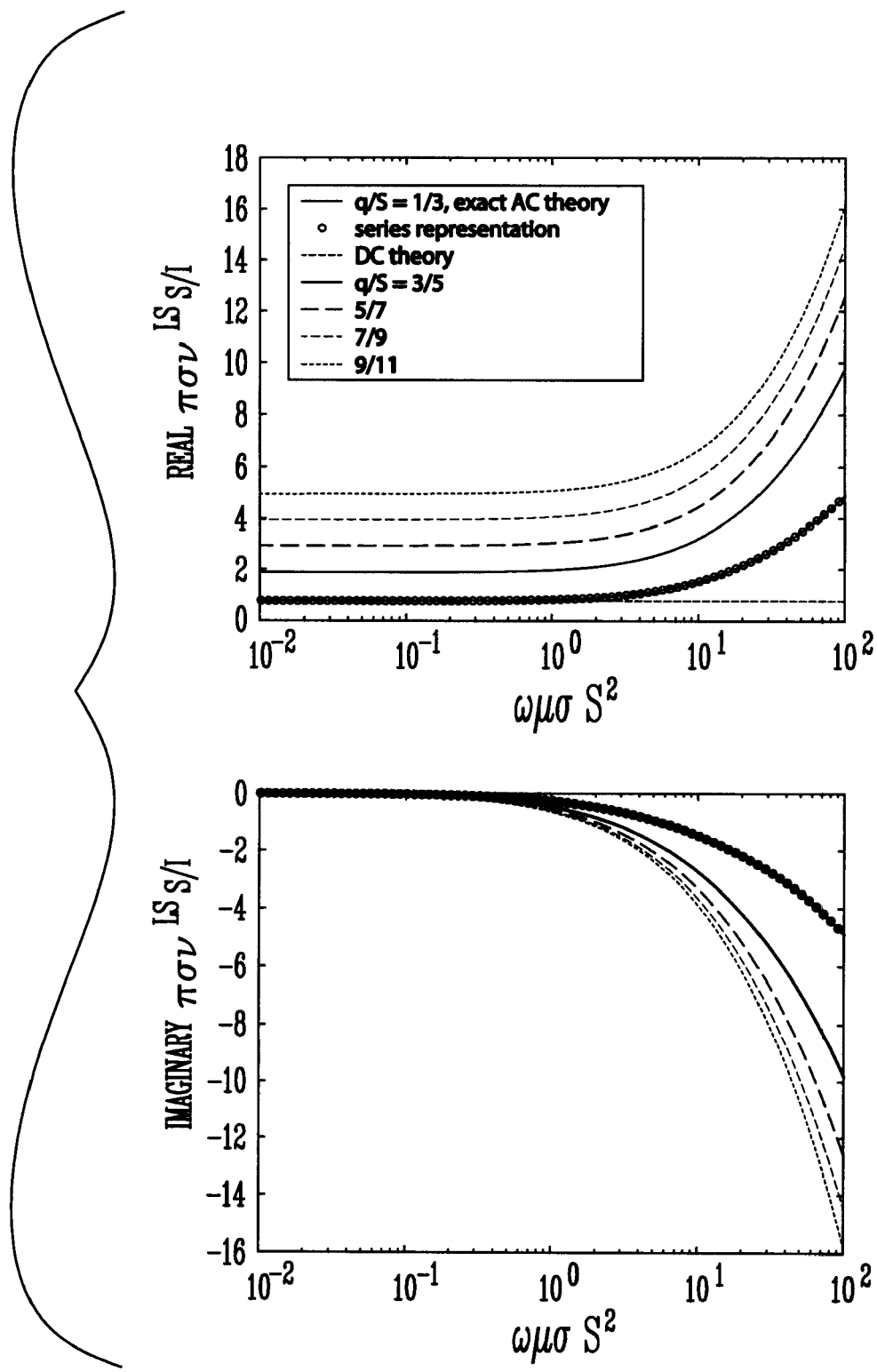
FIG. 6 is a graph illustrating a dimensionless pickup voltage, $\pi\sigma v^{LS}S/I$, as a function of dimensionless frequency, $\omega\mu\sigma S^2$, in the case of a co-linear, symmetric probe, for q/S=⅓(0.333), ⅗(0.600), 5/7(0.714), 7/9(0.778) and 9/11(0.818).

In FIG. 6, the real and imaginary parts of the dimensionless voltage, $\pi\sigma v^{LS}/I$, are plotted versus dimensionless frequency, $\omega\mu\sigma S^2$, for various values of the ratio of pickup length to current injection length q/S, for a co-linear symmetric probe. It can be seen that the voltage increases as the pickup points approach the current injection points more closely, i.e. as q/S increases. Voltage values calculated using the series representation for v, equation (B.23), are also shown for the probe with equally-spaced probe points, q/S=⅓. To achieve agreement to within 2 percent of values calculated using the exact solution at the highest frequency considered, 30 terms in the series are required. As q/S increases, yet more terms are needed.

Figure 7:
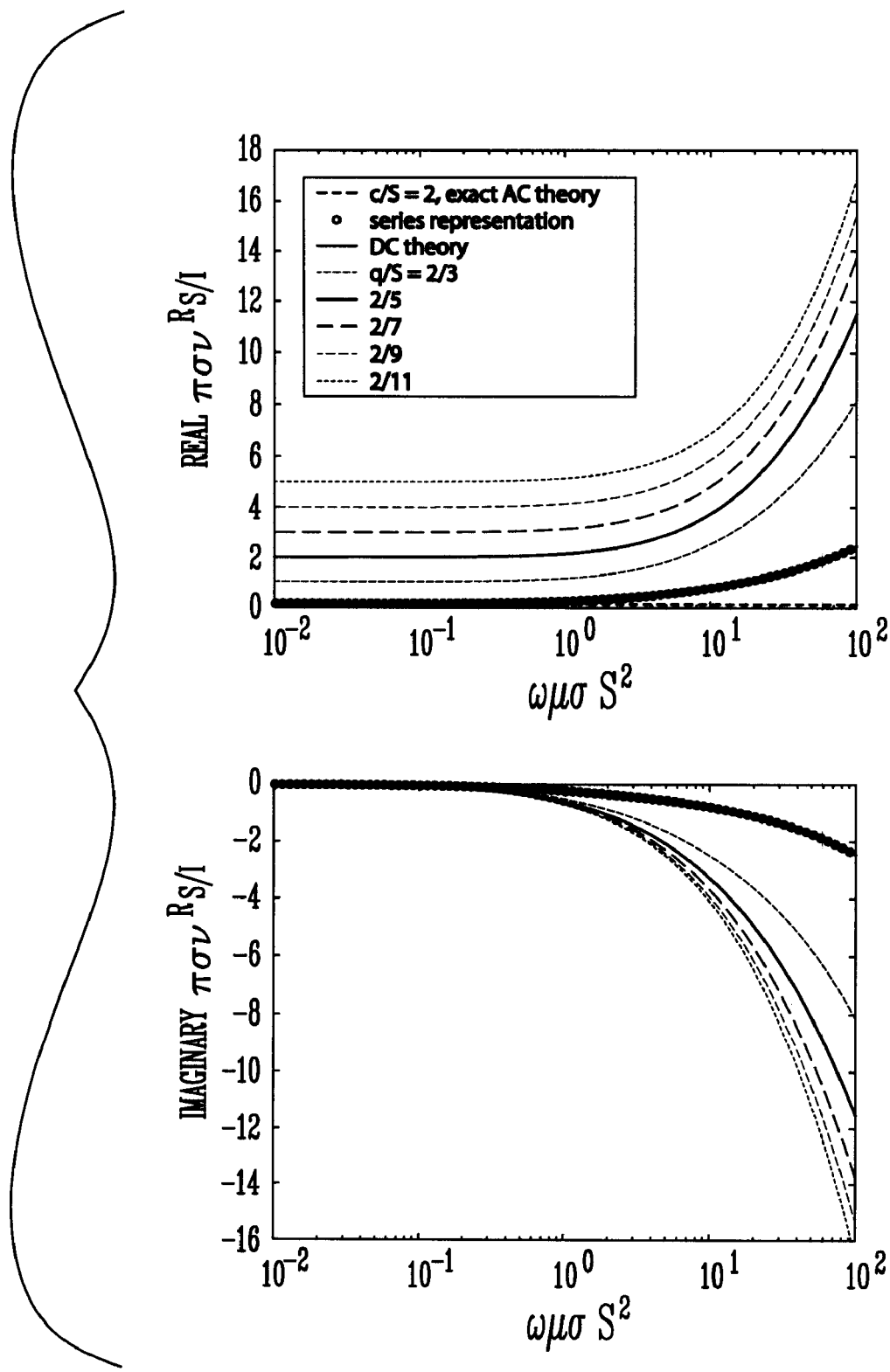
FIG. 7 is a graph illustrating dimensionless pickup voltage, $\pi\sigma^R S/I$, as a function of dimensionless frequency, $\omega\mu\sigma S^2$, in the case of a rectangular probe, for c/S=2, ⅔ (0.667), ⅖(0.400), 2/7(0.286), 2/9(0.222) and 2/11(0.182).

In FIG. 7, the real and imaginary parts of the dimensionless voltage, $\lambda\sigma v^R S/I$, are plotted versus dimensionless frequency, $\omega v\sigma S^2$, for various values of the aspect ratio of a rectangular probe, c/(2S). Again, the pickup voltage increases as the pickup points approach the current injection points more closely, i.e. as c/S decreases. To achieve agreement within 2 percent between values calculated using the exact solution (equation (B.19)) and the series solution (equation (B.23)) for a square-head probe (c/S=2) at the highest frequency considered, 70 terms in the series are required.

In both FIG. 6 and FIG. 7, it is evident that below a certain frequency, the pickup voltage is approximately real and constant. In this low-frequency regime, the measured voltage matches that obtained in the dc limit and equation (B.26) applies. Hence, in the low-frequency regime, v is independent of μ, and σ may be determined independent of μ by adjusting the value of σ until theory matches low-frequency experimental data. Once σ is known, μ may be determined by fitting theory with experimental data taken at higher frequencies. This procedure is demonstrated in [16] in characterizing metal plates which are somewhat thinner than the probe length [17].

Comparing results shown in FIG. 6 and FIG. 7 it can be seen that the co-linear and rectangular probes perform more similarly as the pickup points approach the current injection points more closely, as is to be expected.

Calculation of ε

It can easily be shown that $E^C$ (equation (B.9)) is conservative ($\nabla \times E^C = 0$) and therefore does not contribute to the integral around the closed loop from which ε is derived (equation (B.4)). Hence, with equations (B.7) and (B.10), $$\varepsilon = \oint_C [E^W(r_+) - E^W(r_-)] \cdot d\mathbf{l} \quad \text{(B.27)}$$

Considering the form of $E^W$ (equation (B.8)) evaluation of the integral in equation (B.27) is straightforward, yielding $$\varepsilon = \frac{l}{2\pi} i\omega\mu_0 l \ln\left[\frac{\sqrt{(S+q)^2 + c^2} \sqrt{(S-p)^2 + c^2}}{\sqrt{(S-q)^2 + c^2} \sqrt{(S+p)^2 + c^2}}\right] \quad (B.28)$$

The self-inductance of the pickup circuit, L, may therefore be expressed as $$L = \frac{l}{2\pi}\mu_0 l \ln\left[\frac{\sqrt{(S+q)^2 + c^2} \sqrt{(S-p)^2 + c^2}}{\sqrt{(S-q)^2 + c^2} \sqrt{(S+p)^2 + c^2}}\right] \quad (B.29)$$

Complex Voltage V

Combining results (B.18) and (B.28) in accordance with equation (B.2) gives, finally, $$V = \frac{I}{2\pi\sigma}[F(S+q,c) - F(S-q,c) - F(S+p,c) + F(S-p,c)] \quad (B.30)$$

where $$F(x,y) = F(\rho = \sqrt{x^2 + y^2}) = \frac{e^{ik\rho}}{\rho} + ik\left[\left(1 - \frac{ikl}{\mu_r}\right)\ln\rho + E_1(-ik\rho)\right] \quad (B.31)$$

and $\mu_r = \mu/\mu_0$ is the relative permeability of the half-space.

Figure 8:
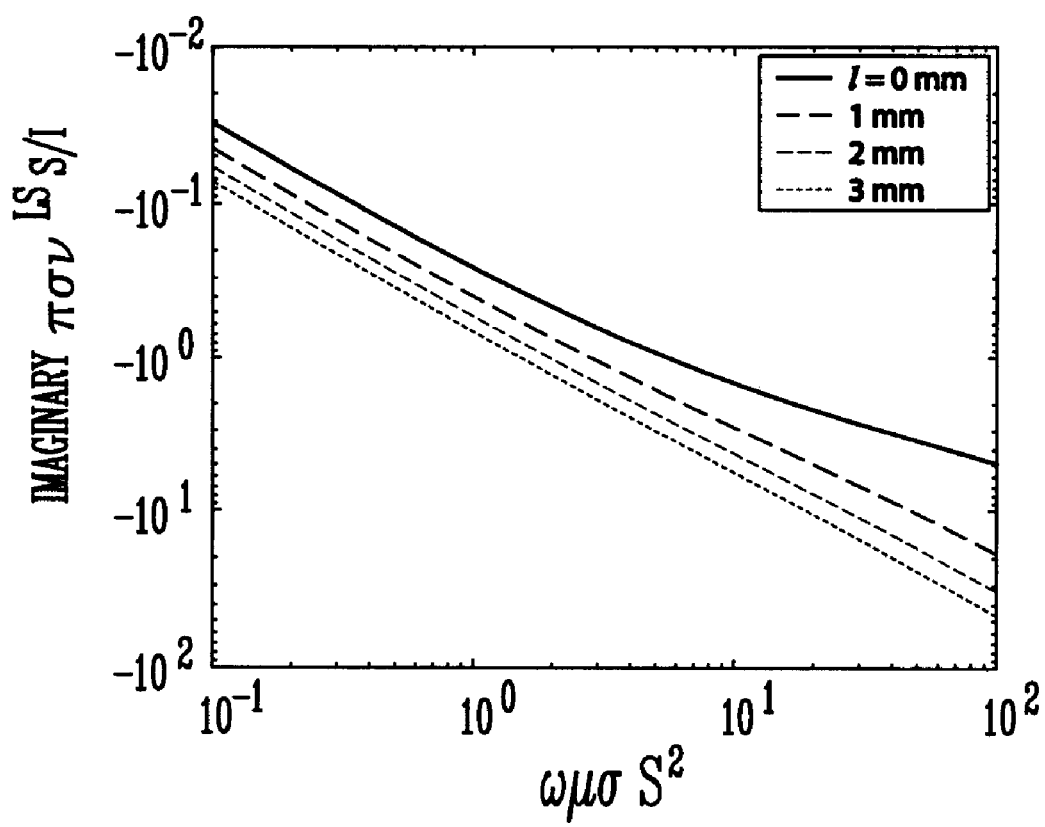
FIG. 8 is a graph illustrating the imaginary part of the dimensionless pickup voltage, $\pi\sigma v^{LS}S/I$, as a function of dimensionless frequency, $\omega\mu\sigma S^2$, in the case of a co-linear, symmetric probe, with q/S=⅓. Curves are plotted for various values of the parameter l, the height of the pickup loop above the conductor surface (FIG. 5). The area of the pickup loop, and hence the inductance of the loop, is proportional l.

In FIG. 8 the effect of varying l on V is shown in the case of a co-linear, symmetric probe with equally-spaced probe points (q/S=⅓). Only the imaginary part of V is shown since $\epsilon$ is purely imaginary and has no influence on the real part of V. It can be seen that, as l increases, Im(V) becomes linear in frequency due to the dominance of $|\epsilon|$ over $|\text{Im}(v)|$. From a practical point of view, it is important to minimize l so that the component of V which carries information about the specimen, v, is not swamped by the inductive term, $\epsilon$.

Experiment

The theoretical expression for the complex voltage (equations (B.30) and (B.31)) has been validated by comparison with experimental data. Two different four-point probes, one with co-linear arrangement of the probe points and one rectangular, were used. The probes were constructed by mounting four sprung, point contacts in a plastic support block. The separation of the contacts was measured using digital calipers. With reference to FIG. 5, the dimensions of the probe are listed in Table 3. The uncertainty in the dimensions derived primarily from some lateral play in the pin position which can occur as the springs are compressed. Measurements of complex voltage were made with the probes in contact with a thick, alloy 2024 aluminum bloc, whose parameters are listed in table 4. The conductivity of the block was measured independently using an eddy-current coil. Details of the conductivity measurement and further details of the experimental procedure for the ACPD measurements can be found in [16, 18].

TABLE 3

Probe parameters.

| Configuration | S (mm) | p (mm) | q (mm) | c (mm) | l (mm) (fitted value) |
|---|---|---|---|---|---|
| Co-linear | 20.03 ± 0.07 | −17.5 ± 0.2 | 17.6 ± 0.4 | 0 | 2.98 ± 0.01 |
| Rectangular | 17.64 ± 0.07 | −17.47 ± 0.07 | 17.55 ± 0.07 | 2.5 ± 0.2 | 2.15 ± 0.01 |

TABLE 4

Half-space parameters conductivity, σ, thickness, T and lateral dimensions, w × d.

| Metal | Alloy | σ (MSm$^{-1}$) | T (mm) | w × d (mm) |
|---|---|---|---|---|
| Aluminum | 2024 | 17.6 ± 0.2 | 101 | 149 × 202 |

The dimensions of the aluminum block, with respect to the dimensions of the probes, are such that some discrepancy between theory and experiment due to edge effects is expected. For the co-linear probe placed centrally on the largest face of the aluminum block, the error due to edge effects is minimized by orienting the line of the probe so that it is parallel with the shorter side of the block face (w=149 mm) [10]. The error is also reduced by employing a probe in which the four points are not equally-spaced, but in which the pickup points are closer to the current injection points. In fact, for the co-linear probe used in this experiment, (q−p)/(2S)≈0.88 and w/(2S)≈3.7 w. For these ratios, and assuming that the aluminum block is 'infinite' in the direction perpendicular to the line of the probe (dimension d), edge effects are expected to lead to a discrepancy of approximately 2 percent between theory and experiment in the dc limit. Since in practice this block is finite in the direction perpendicular to the line of the probe (d=202 mm), a discrepancy a little larger than 2 percent is expected between theory and experiment in the dc limit, becoming smaller as frequency increases, due to greater confinement of the electric field in the region of the probe. According to calculations of DCPD as a function of the ratio of plate thickness to probe dimension (here T/S=5[17], the thickness of the block is expected to approximate a half-space very well, with no significant error arising due to its finite thickness.

Figure 9:
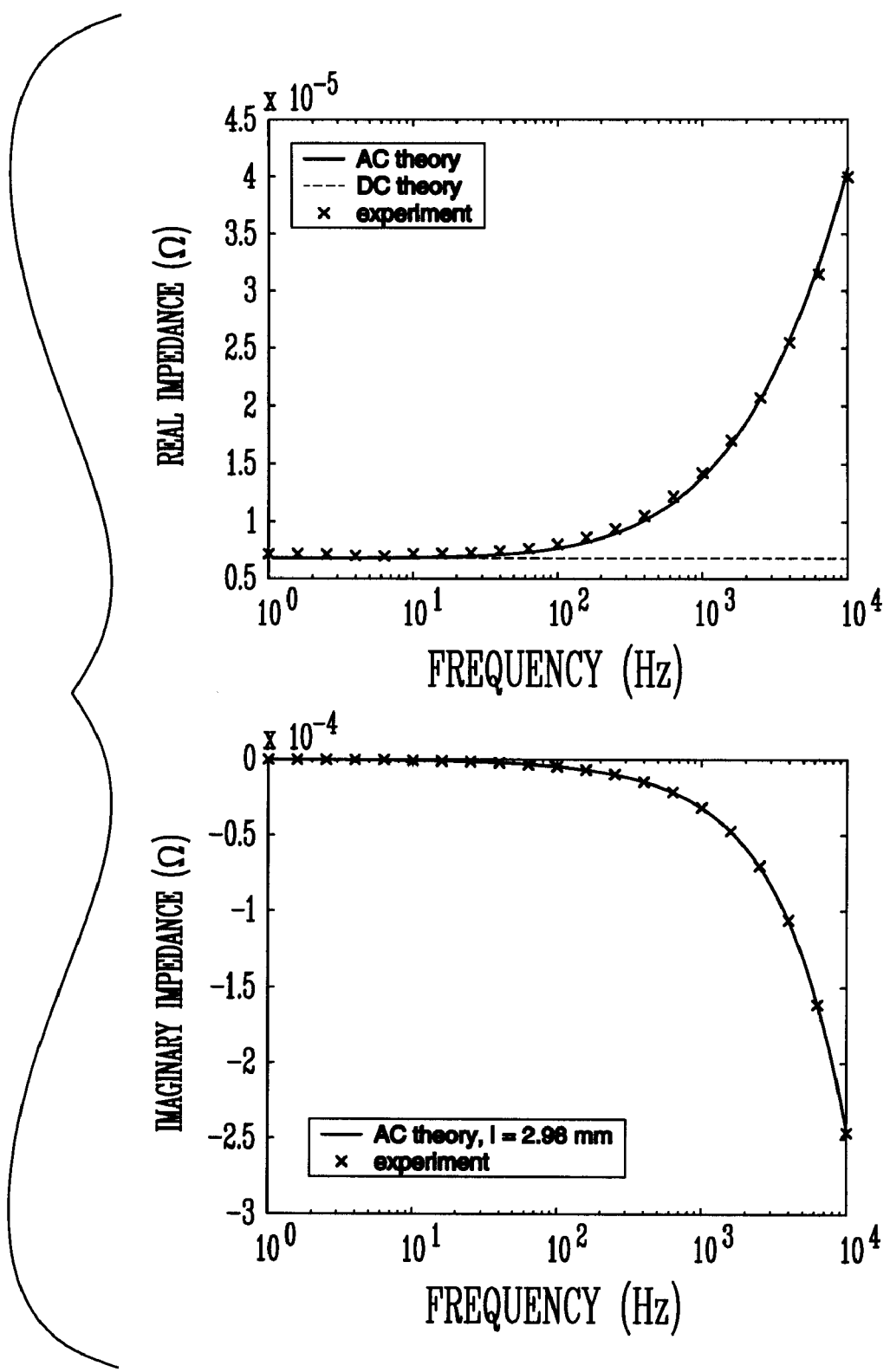
FIG. 9 is a graph illustrating impedance (V/I) measured by a co-linear, four-point probe (table 3) in contact with an aluminum block (table 4), compared with theory expressed in equation (B.30), as a function of frequency.
Figure 10:
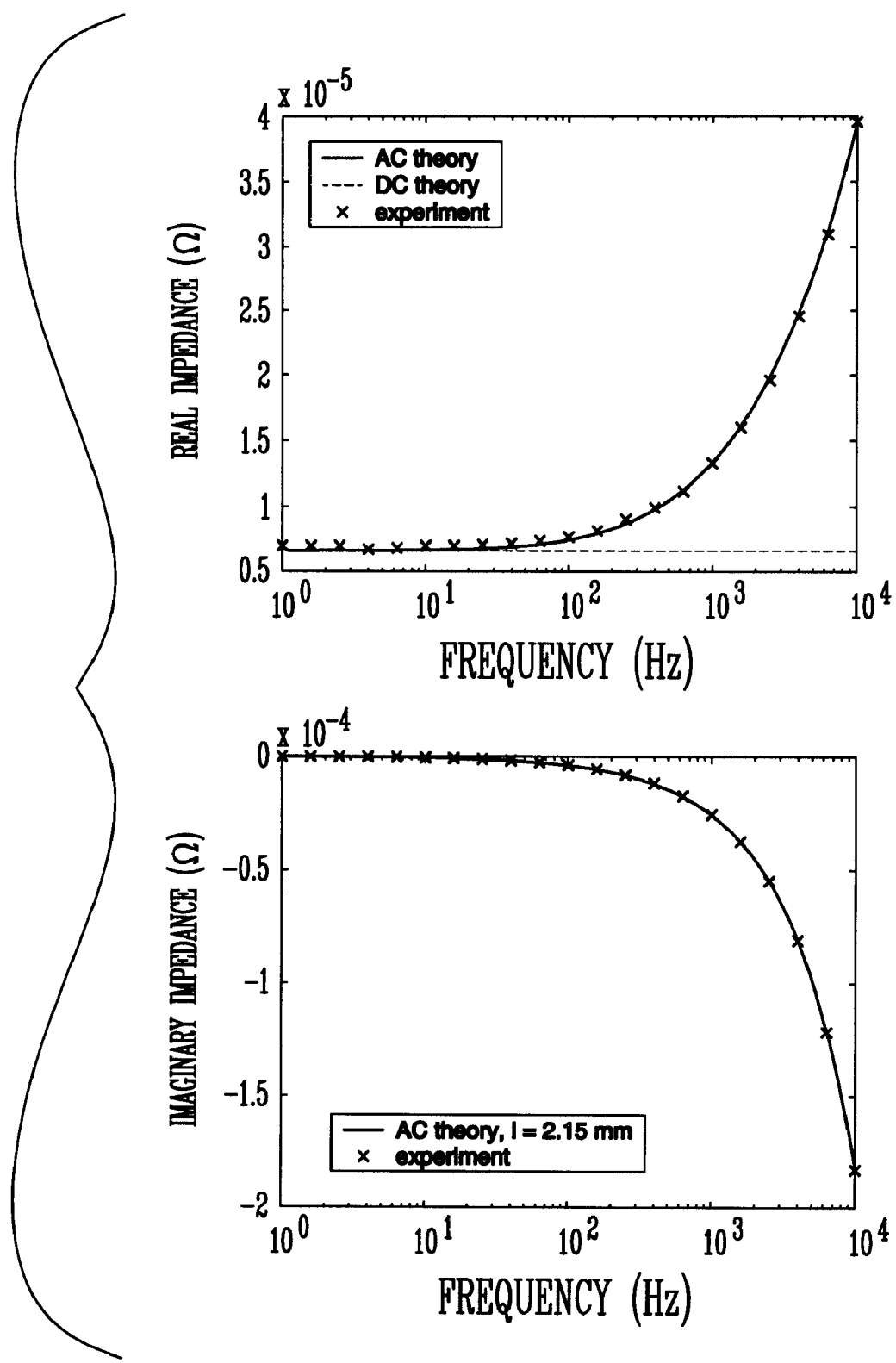
FIG. 10 is a graph illustrating impedance (V/I) measured by a rectangular, four-point probe (table 3) in contact with an aluminum block (table 4), compared with theory expressed in equation (B.30), as a function of frequency.

Experimental measurements made with co-linear and rectangular probes are compared with theory in FIG. 9 and FIG. 10, respectively. In both cases, there is very good agreement between theory and experimental data. The calculated curves shown for the imaginary part of the impedance have been obtained by adjusting the value of the vertical dimension of the pickup circuit, l (see FIG. 5), to give the best fit to the experimental data. For the co-linear probe, l=2.98 mm. For the rectangular probe, l=2.15 mm. Both these values are similar to the physical values of l for these probes. No free parameters are involved in obtaining the theoretical curves for the real part of the impedance shown in FIG. 10 and FIG. 11. The discrepancy between theory and experiment in the low-frequency regime is approximately 4 percent for both sets of measurements. The fact that the measured real part of V is larger than that predicted by theory, rather than smaller, indicates that edge effects are likely responsible for the discrepancy. Other significant sources of error are the uncertainty in the probe dimensions and in the conductivity of the same.

Thus, an exact solution for the complex, frequency-dependent voltage measured between the pickup points of a four-point probe in contact with a metal half-space has been derived. Very good agreement between theory and experiment on an aluminum block has been obtained, for co-linear and rectangular arrangements of four probe points. As well as providing a method for measuring electrical conductivity and effective magnetic permeability of thick metal specimens, the present invention allows for theoretical analysis of four-point ACPD on stratified planar conductors, for the practical purpose of nondestructive evaluation of conductive surface treatments and coatings.

REFERENCES

The following references are cited in the disclosure, all of which are herein incorporated by reference in their entireties.

[1] W. J. Duffin, *Electricity and magnetism*, McGraw-Hill, London, 1980. 3rd Edition.

[2] N. Bowler, "Analytical solution for the electric field in a half space conductor due to alternating current injected at the surface", *J. Appl. Phys.*, Vol. 95, no. 1, pp. 344-348 (2004)

[3] V. G. Gerasimov, A. D. Kovachev, Yu. V. Kulaev and A. D. Pokrovskii, "An analysis of the operation of a transducer with contact excitation in fatigue tests of flat samples", *Defektoskopiya*, No. 1, pp. 21-32 (1981)

[4] M. Abramowitz and I. A. Stegun (eds.), *Handbook of mathematical functions with formulas, graphs and mathematical tables* (Dover, N.Y., 1972)

[5] A. Erdelyi (ed.), *Tables of integral transforms* Vol. II (McGraw-Hill, New York, 1954)

[6] M. Yamashita and M. Agu, "Geometrical correction factor for semiconductor resistivity measurements by four-point probe method", *Japanese J. Appl. Phys.*, Vol. 23, no. 11, pp. 1499-1504 (1984)

[7] Reynolds J M 1997 *Introduction to Applied and Environmental Geophysics* Chichester: Wiley)

[8] Parasnis D S 1997 *Principles of Applied Geophysics* 5th edn (London: Chapman and Hall)

[9] Schroder D K 1998 *Semiconductor Material and Device Characterization* (New York: Wiley)

[10] Moore P O and McIntire P (ed) Stanley R K (technical ed) 1995 *Nondestructive Testing Handbook (Special Nondestructive Testing Methods* vol 9) 2nd edn (Columbus: American Society of Nondestructive Testing).

[11] Moore P O (ed) and Udpa S S (technical ed) 2004 *Nondestructive Testing Handbook (Electromagnetic Testing* vol 5) 3rd edn (Columbus: American Society of Nondestructive Testing).

[12] Mitrofanov V A 1998 *Russ. J. Nondestr. Test.* 34 183-9.

[13] Bowler N 2004 *J. Appl. Phys.* 96 4607-13.

[14] Gradshteyn I S and Ryzhik I M (ed) 2000 *Table of Integrals, Series and Products* 6th edn (London: Academic).

[15] Uhlir A Jr 1955 *Bell Syst. Tech. J.* 34 105-28.

[16] Bowler N and Huang Y 2005 *IEEE Trans. Magn.* 41 2102-10.

[17] Bowler N 2006 *Res. Nondestr. Eval.* 17 29-48.

[18] Bowler N and Huang Y 2005 *Meas. Sci. Technol.* 16 2193-200.

What is claimed is:

1. A method of determining material parameters associated with a conductor using four points, comprising:
    injecting and extracting alternating current into the conductor using current-carrying wires operatively connected to two of the four points at each of a plurality of frequencies;
    measuring potential drop between the remaining two of the four points at each of the plurality of frequencies; and
    calculating conductivity or thickness of the conductor using the potential drop and the alternating current amplitude from a first subset of the plurality of frequencies;
    determining magnetic permeability for the conductor from a second subset of the plurality of frequencies, the second subset of the plurality of frequencies including frequencies higher than frequencies in the first subset.

2. The method of claim 1 wherein the conductor is a plate.

3. The method of claim 2 wherein the thickness is plate thickness.

4. The method of claim 1 wherein the conductor is a stratified conductor.

5. The method of claim 1 wherein the conductor is a conductive surface treatment.

6. The method of claim 1 wherein the conductor is a coating.

7. The method of claim 1 wherein the conductor comprises a ferrous metal.

8. The method of claim 1 wherein the four points are co-linear.

9. The method of claim 1 wherein the four points are in a rectangular configuration.

10. The method of claim 1 wherein the four points are randomly placed.

11. The method of claim 1 wherein the conductor comprises a metal half-space.

12. The method of claim 1 wherein the step of calculating includes applying an analytical expression.

13. The method of claim 1 wherein the conductor is of cylindrical shape.

14. The method of claim 1 wherein the conductor is a tube.

15. The method of claim 1 wherein the conductor is a stratified cylinder.

16. A method of determining material parameters associated with a conductor by using a four points probe, the method comprising:
    injecting and extracting alternating current into the conductor using current-carrying wires operatively connected to two of the four points of the four point probe at each of a plurality of frequencies;
    measuring potential drop, V, between the remaining two (p, q) of the four points of the four point probe at each of the plurality of frequencies;
    applying an analytical expression relating the voltage, V, measured between points p and q at each of the plurality of frequencies, the electromagnetic skin depth of the conductor and the amplitude of the alternating current to determine the magnetic permeability based on a first subset of the plurality of frequencies and conductivity of the conductor based on a second subset of the plurality of frequencies, the first subset including frequencies higher than the frequencies in the second subset.

17. The method of claim 16 wherein the conductor is a homogenous metal.

18. The method of claim 17 wherein the conductor is a plate.

19. The method of claim 16 wherein the conductor comprises a ferrous material.

20. A method of determining material parameters associated with a conductor using four points, comprising:

injecting and extracting a time-varying current into the conductor using current-carrying wires operatively connected to two of the four points;

measuring potential drop between the remaining two of the four points using a measurement circuit;

determining the material parameters of conductivity, thickness, and magnetic permeability from the potential drop, characteristics of the time-varying current, and an analytic model of an electromagnetic field in the conductor; and wherein the analytic model provides for defining a complex voltage for the potential drop with a first contribution to the complex voltage due to the time-varying current into the conductor and a second contribution to the complex voltage due to induction in a loop of the measurement circuit, evaluating both the first contribution and the second contribution to thereby decouple the conductivity from the magnetic permeability and provide for calculating both the conductivity and the magnetic permeability.

* * * * *